United States Patent [19]

Masuoka

[11] Patent Number: 5,719,805
[45] Date of Patent: Feb. 17, 1998

[54] ELECTRICALLY PROGRAMMABLE NON-VOLATILE SEMICONDUCTOR MEMORY INCLUDING SERIES CONNECTED MEMORY CELLS AND DECODER CIRCUITRY FOR APPLYING A GROUND VOLTAGE TO NON-SELECTED CIRCUIT UNITS

[75] Inventor: Fujio Masuoka, Yokohama, Japan

[73] Assignee: Kabushiki Kaisha Toshiba, Kawasaki, Japan

[21] Appl. No.: 953,768

[22] Filed: Sep. 30, 1992

Related U.S. Application Data

[63] Continuation of Ser. No. 587,485, Sep. 21, 1990, abandoned, which is a continuation of Ser. No. 184,814, Apr. 22, 1988, abandoned.

[30] Foreign Application Priority Data

| Apr. 24, 1987 | [JP] | Japan | 62-100056 |
| Apr. 24, 1987 | [JP] | Japan | 62-101422 |
| Apr. 24, 1987 | [JP] | Japan | 62-101423 |

[51] Int. Cl.[6] .............. G11C 16/04; G11C 16/06; G11C 7/02
[52] U.S. Cl. .............. 365/185.02; 365/185.17; 365/185.18; 365/230.06
[58] Field of Search .............. 365/63, 72, 104, 365/184, 185, 218, 185.11, 185.17, 185.18, 185.25, 185.02, 230.03, 230.06; 307/465, 468; 326/105, 106

[56] References Cited

U.S. PATENT DOCUMENTS

| 4,207,618 | 6/1980 | White, Jr. et al. | 365/222 |
| 4,233,526 | 11/1980 | Kurogi et al. | 365/184 |
| 4,371,956 | 2/1983 | Maeda et al. | 365/185.21 |
| 4,377,857 | 3/1983 | Tickle | 365/185.33 |
| 4,437,172 | 3/1984 | Masuoka | 365/218 |
| 4,437,174 | 3/1984 | Masuoka | 365/218 |
| 4,467,453 | 8/1984 | Chiu et al. | 365/185.16 |
| 4,533,843 | 8/1985 | McAlexander, III et al. | 327/57 |
| 4,580,247 | 4/1986 | Adam | 365/185.1 |
| 4,648,074 | 3/1987 | Pollachek | 365/184 |
| 4,742,491 | 5/1988 | Liang et al. | 365/104 |
| 4,763,305 | 8/1988 | Kuo | 365/218 |
| 4,933,904 | 6/1990 | Stewart et al. | 365/185 |

FOREIGN PATENT DOCUMENTS

| 0071587 | 5/1982 | Japan | 365/185 |
| 0098191 | 6/1982 | Japan . | |
| 60-182162 | 9/1985 | Japan . | |

OTHER PUBLICATIONS

Kupel et al, "Triple Level Polysilicon E[2] PROM With Single Transistor Per Bit," International Electron Devices Meeting, pp. 602–606, (Dec. 1980).

(List continued on next page.)

*Primary Examiner*—Glenn Gossage
*Attorney, Agent, or Firm*—Banner & Witcoff, Ltd.

[57] ABSTRACT

A semiconductor memory includes memory cells divided into a plurality of a series circuit units arranged in matrix fashion and comprising a plurality of memory cells connected in series. The memory cells each consist of a non-volatile transistor having a control gate electrode, a floating gate electrode and an erase gate electrode, and may comprise EEPROM cells. One end of each series circuit unit is coupled to a bit line with the circuit units in a given column of circuit units being coupled to the same bit line. Row lines are provided wherein each circuit unit in a given row of circuit units has the control gate electrodes of its memory cells coupled to a row line, the control gate electrodes of each memory cell in a given row of memory cells being connected to a common row line. A voltage by which a selected non-volatile transistor is driven to its saturation state is applied to the control gate electrode of the selected transistor through the corresponding row line. Another voltage is applied to the control gate electrodes of the remaining non-selected non-volatile transistors of the series circuit unit. A ground voltage, or zero volts, may be applied to the row, lines in certain non-selected circuit units.

28 Claims, 13 Drawing Sheets

OTHER PUBLICATIONS

Patent Abstracts of Japan, vol. 12 No. 86, for JP 62-219296 (abstract only), application published Sep. 26, 1987.

Georghe Samachisa, Chien-Sheng Su, Yu-Sheng Kao, George Smarandoiu, Ting Wong, "*A 128K Flash EEPROM Using Double Polysilicon Technology*", Feb. 25, 1987, pp. 76-77, ISSCC 87.

Dumitru Cioaca, Tien Lin, Agnes Chan, Ling Chen, Andrei Mihnea, "*A Million-Cycle CMOS 256K EEPROM*", ISSCC 87, Feb. 25, 1987, pp. 78-80.

Adler, "Densely Arrayed EEPROM Having Low-Voltage Tunnel Write", IBM Tech. Disc. Bull., vol. 27, No. 6, Nov. 1984, pp. 3302-3307.

Stewart et al, "A High Density EPROM Cell Array", Symposium on VLSI Technology, Digest of Technical Papers, May 1986, pp. 89-90.

Kotecha, "Electrically Alterable Non-Volatile Logic Circuits", IBM TDB, vol. 24, No. 7B, Dec. 1981, pp. 3811-3812.

ELECTRICALLY PROGRAMMABLE NON-VOLATILE SEMICONDUCTOR MEMORY INCLUDING SERIES CONNECTED MEMORY CELLS AND DECODER CIRCUITRY FOR APPLYING A GROUND VOLTAGE TO NON-SELECTED CIRCUIT UNITS

This is a continuation of application Ser. No. 07/587,485, filed Sep. 21, 1990, now abandoned, which is a continuation of application Ser. No. 07/184,814, filed Apr. 22, 1988, also now abandoned.

This application is related by subject matter to commonly assigned application Ser. No. 07/184,951, now abandoned filed on Apr. 22, 1988 in favor of continuation application Ser. No. 07/900,509, filed on Jun. 17, 1992 now U.S. Pat. No. 5,245,566.

BACKGROUND OF THE INVENTION

1. Field of the Invention

This invention generally relates to a programmable semiconductor memory using non-volatile transistors as memory cells from which data can be electrically erased. It particularly relates to a non-volatile semiconductor memory in which data stored in a plurality of memory cells may be erased simultaneously or in units of a row. Data may be written to the memory a cell (or bit) at a time.

2. Description of the Prior Art

Non-volatile semiconductor memories from which data may be erased are known as EPROMs (Erasable and Programmable Read Only Memories). EPROMs from which the data may be erased electrically are called $E^2$ PROMs (Electrically erasable PROMS). $E^2$ PROMs have been developed which permit the simultaneous erasure of data stored in a plurality of memory cells. Such an $E^2$ PROM is disclosed in "A 128K Flash EEPROM Using Double Polysilicon Technology", pp. 76–77 of "1987 IEEE International Solid State Circuits Conference, Digest of Technical Papers."

FIG. 1 is a circuit diagram depicting a memory cell array of a prior art $E^2$ PROM in which the data stored in the memory cells may be erased simultaneously. In the Figure, memory cells 50 consist of non-volatile transistors having a floating gate electrode, a control gate electrode and an erase gate electrode. Data erasure may be effected electrically. Memory cells 50 are arranged in rows (disposed horizontally) and columns (disposed horizontally). The drains of the memory cells 50 in a given row are commonly connected to one of bit lines 51. The sources of the memory cells 50 in a given row are commonly connected to one of ground lines 52. The control gate electrodes of the memory cells 50 in a given column are commonly connected to one of column lines 53. Finally, the erase gate electrodes of the memory cells 50 in a given row are commonly connected to one of erase lines 54. Such a memory cell array is disclosed in U.S. Pat. No. 4,437,174.

In such a prior art $E^2$ PROM, each memory cell consists of a single non-volatile transistor which may contain a single bit of data. Each memory cell is connected to a corresponding bit line, ground line, column line and erase line. Thus, in such a configuration, four wires, namely, the bit line, ground line, column line and erase line, are required for each bit. Furthermore, the drain of each cell consists of a diffusion region and the bit line consists of a metal wire of, for example, aluminum. Thus when a cell is connected to its corresponding bit line, a contact is required. The position of formation of a contact usually requires an area wider than the wire width. This makes it difficult to attain high integration densities of the cells. A large number of contacts lowers the manufacturing yield.

The present invention overcomes the above-noted problems of the prior art by reducing the number of wires required for each bit or cell and reducing the number of contacts coupling the cells to the bit lines.

SUMMARY OF THE INVENTION

Accordingly, an object of this invention is to provide a non-volatile semiconductor memory wherein a high integration density can be achieved by reducing the number of wires and the number of contacts.

Another object of this invention is to provide a non-volatile semiconductor memory with a low manufacturing cost.

Yet another object of this invention is to provide a non-volatile semiconductor memory which permits an increased production yield.

The non-volatile semiconductor memory of this invention comprises a plurality of series circuit units arranged in a row and column matrix with each series circuit unit having at least two memory cells connected in series. Each memory cell consists of a non-volatile transistor having a control gate electrode, a floating gate electrode, and an erase gate electrode. Data stored in the memory cells may be erased electrically. One end of each series circuit unit is coupled to a bit line, the circuit units in a given column of circuit units being coupled to the same bit line. The control gate electrodes of the memory cells in a given row of memory cells are coupled to the same row line and the erase gate electrodes of the memory cells in a given series circuit unit are commonly coupled to an erase line, the circuit units in a given column of circuit units being coupled to the same erase line.

BRIEF DESCRIPTION OF THE DRAWINGS

A more complete appreciation of the invention and many of the attendant advantages thereof will be readily appreciated as the invention becomes better understood by reference to the following detailed description when considered in connection with the accompanying drawings, wherein.

DETAILED DESCRIPTION OF THE PREFERRED EMBODIMENTS

Figure 1:
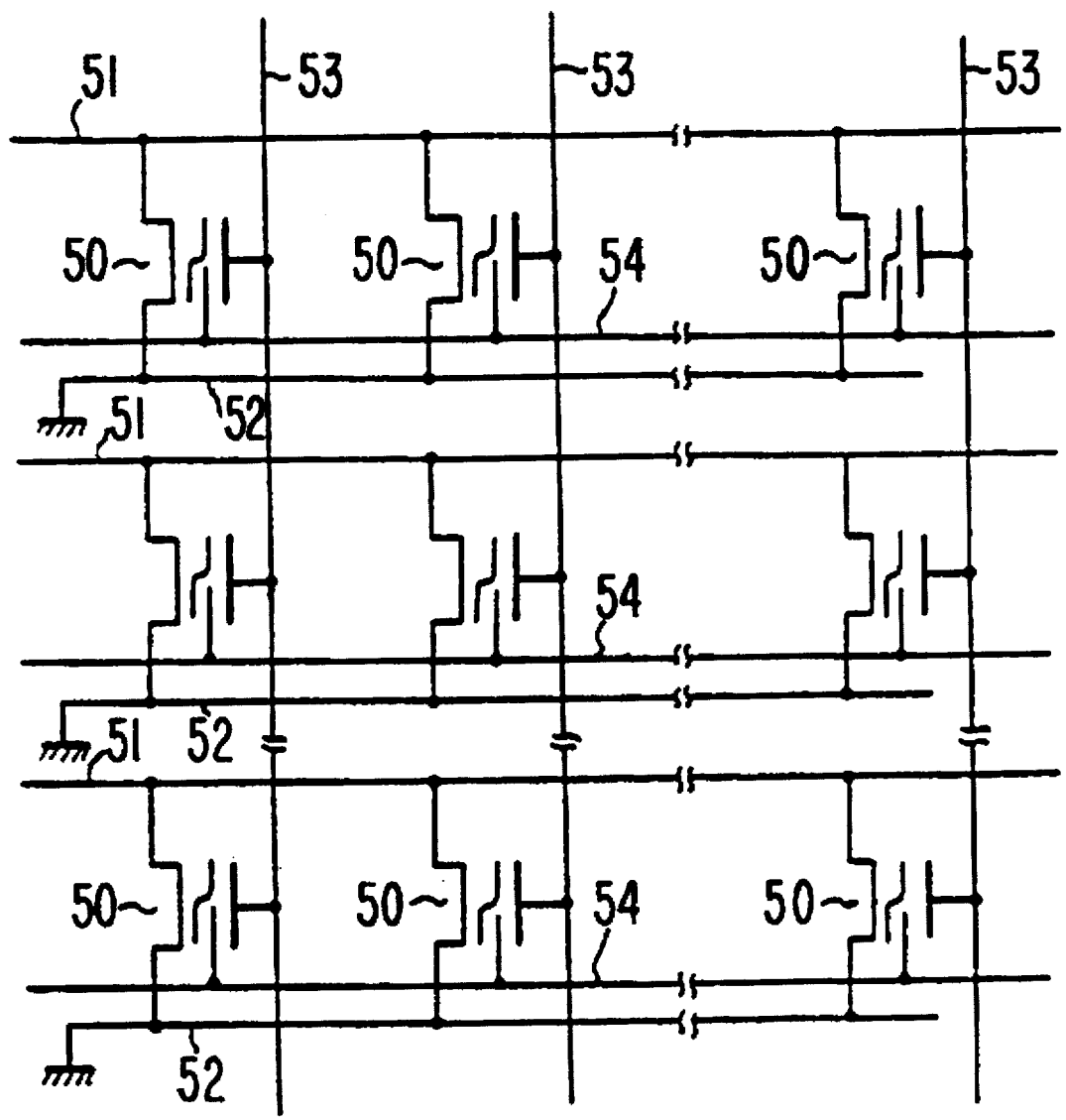
FIG. 1 is a circuit diagram of a prior art non-volatile semiconductor memory.
Figure 2:
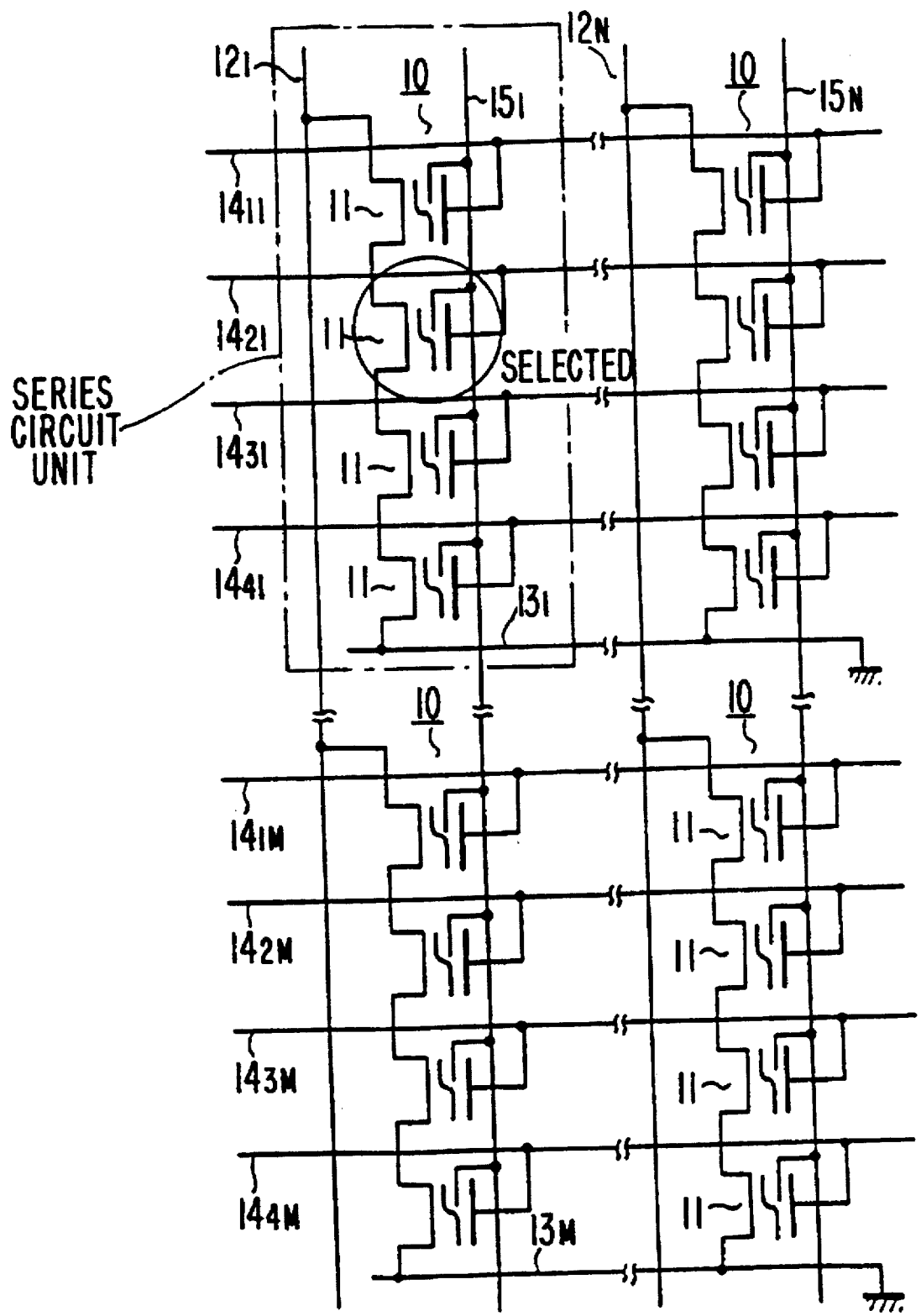
FIG. 2 is a circuit diagram of one embodiment of this invention.

FIG. 2 is a circuit diagram of a memory cell array in which the present invention is applied to an $E^2$ PROM (hereafter referred to simply as "memory"). In the Figure, series circuit unit 10 includes four memory cells 11 connected in series. Each memory cell 11 of series circuit unit 10 consists of a non-volatile transistor having: a source region; a drain region; a floating gate electrode arranged above the channel region between the source and drain regions; a control gate electrode; and an erase gate electrode arranged so as to overlap the floating gate electrode. Data stored in a memory cell 11 may be erased electrically.

Generally, the present invention may be applied to what may be termed programmable memories. Programmable memory as used herein refers to any kind of semiconductor memory which can be programmed before, during, or after fabrication or manufacture. It may include, but should not be limited to, non-volatile memories, MASKROMs, SRAMs, and DRAMs.

A plurality of these series circuit units 10 are arranged in matrix fashion as shown in FIG. 2. The series circuit units are disposed in rows and columns. As used herein, "column" refers to that which extends vertically or from top to bottom as viewed in FIG. 2. "row" refers to that which extends horizontally or from left to right as viewed in FIG. 2. For clarity in subsequent discussion, it should be noted that each row of series circuit units in FIG. 2 includes four row of memory cells, the control gates of the memory cells disposed in a given row of memory cells being coupled to the same one of row lines 14. Although these terms have been defined for clarity of description, they should not be read to limit in any way the scope of the invention, but rather to facilitate understanding. One end of each series circuit unit 10 is coupled to one of bit lines $12_1, \ldots 12_N$, with the series circuit units in a given column of series circuit units being coupled to the same bit line. The other end of each series circuit unit 10 is coupled to one of ground lines $13_1, \ldots 13_M$, with the series circuit units in a given row of series circuit units being coupled to the same ground line. A voltage of 0V is maintained across ground lines 13. The erase gate electrodes of each memory cell in a series circuit unit are coupled to a common erase line 15, with the series circuit units in a given column being coupled to the same erase line. The control gate electrode of each memory cell in a series circuit unit is coupled to a row line 14, with each memory cell in a given row of memory cells being coupled to the same row line. Thus, in the embodiment of FIG. 2, row lines $14_1, 14_2, 14_3, 14_4$ are coupled respectively to each of the four memory cells comprising a series circuit unit.

Figure 3:
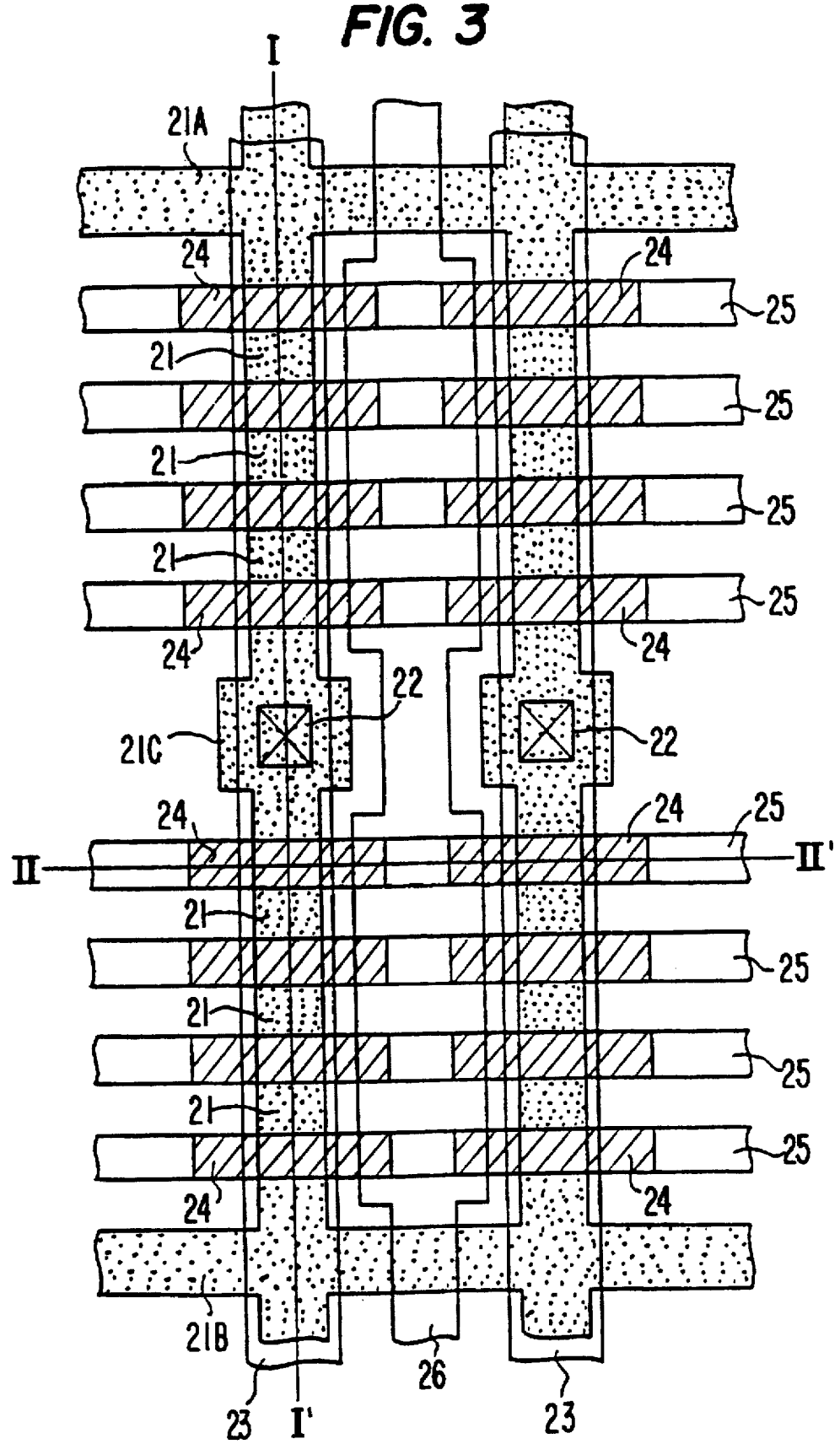
FIG. 3 is a plan view of a pattern showing the memory cell array of the circuit diagram corresponding to FIG. 2.
Figure 4:
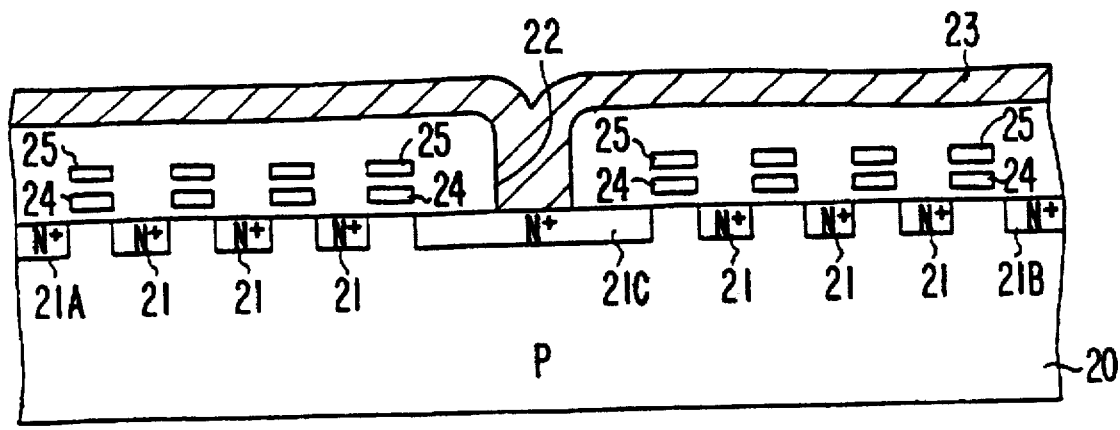
FIG. 4 and FIG. 5 are cross-sectional views taken along lines I–I II–II", respectively, of FIG. 3.
Figure 5:
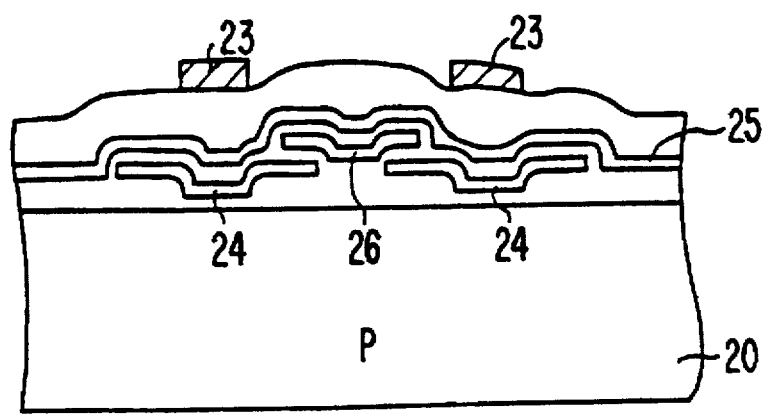

FIG. 3 is a plan view corresponding to the structure of the memory cell array circuit shown in FIG. 2 when such a memory is actually provided on a semiconductor chip. FIG. 4 is a cross-sectional view along the line I–I' in FIG. 3. FIG. 5 is a cross-sectional view along the line II–II' in FIG. 3.

In this embodiment, a P-type silicon semiconductor substrate is used as the substrate 20 of the memory. Separate N+type regions 21, providing the source and drain regions of the four memory cells 11 in each series circuit unit 10, are formed in the surface region of the substrate 20. N+ regions 21A and 21B, positioned in the uppermost and lowermost portions of FIG. 3 respectively, are common to neighboring series circuit units 10. N+ regions 21A and 21B are used as ground lines 13. Metal wires 23 of aluminum, for example, are coupled through contact holes 22 to each of the N+ type regions 21C located between N+ regions 21A and 21B. Metal wires 23 are used as bit lines 12. Electrodes 24, made of a first polycrystalline silicon layer and put in a floating electrical state, are formed between adjacent N+type regions 21 and are insulated therefrom by an insulating film. Electrodes 24 are the floating gate electrodes of memory cells 11. Electrodes 25, made of a third polycrystalline silicon layer, are formed over the plurality of electrodes 24 shown in FIG. 3, insulated therefrom by an insulating film. Electrodes 25 are the control gate electrodes and serve as the row lines 14 of each memory cell 11. Electrodes 26, made of a second polycrystalline silicon layer, are formed between adjacent column of series circuit units 10, insulated therefrom by an insulating film. These electrodes 26 overlap a portion of electrodes 24 made of the first polycrystalline layer. Electrodes 26 are the erase gate electrodes and serve as the erase line 15 coupled to each memory cell 11.

In this embodiment of the memory, each series circuit unit 10 consists of four memory cells 11 connected in series. In practice various numbers of memory cells may be used and the invention should not be understood as limited in this respect. One end of each series circuit 10 is coupled to a bit line 12 which is embodied in metal wire 23 while the other end is coupled to a ground line 13 which is embodied in N+ region 21A or 21B. The control gate electrode of each memory cell 11 is coupled to a row line 14 embodied in electrode 25 and the erase gate electrode of each memory cell 11 is coupled to an erase line 15.

Figure 6:
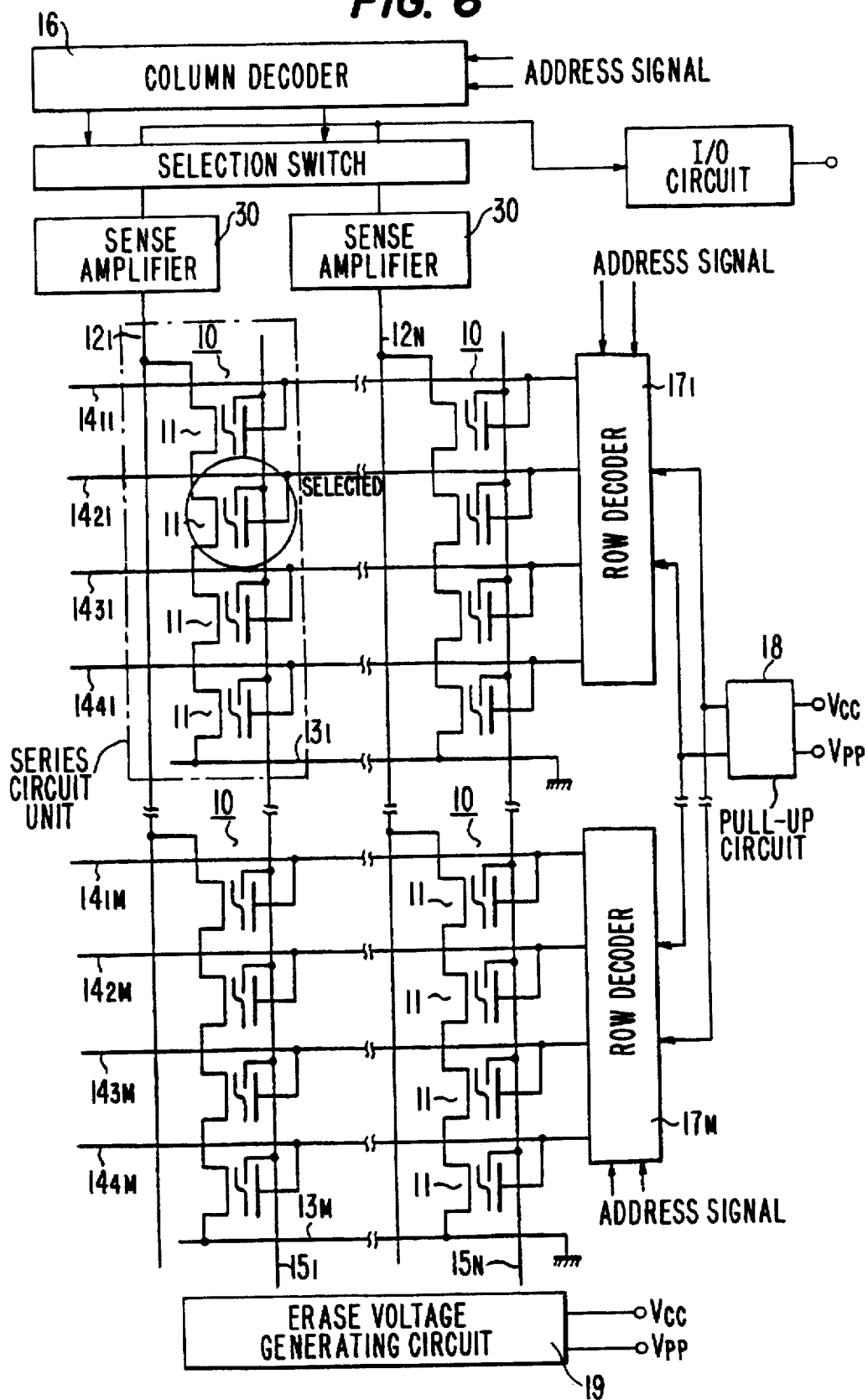
FIG. 6 is a circuit diagram showing the entire layout, including peripheral circuitry, of the memory of FIG. 1.

FIG. 6 is a circuit diagram showing the overall construction of this embodiment together with its peripheral circuitry. The series circuit units are disposed in a matrix of M row and N columns, with each of the M rows of circuit units having four row lines designated $14_{1m}, 14_{2m}, 14_{3m}, 14_{4m}$ where m is the row number. Bit lines 12 are connected to column decoder 16 while the four row lines 14 associated with a given row of series circuit units are connected to the corresponding row decoder 17. Pulled up voltages, produced by pull-up circuit 18 by pulling-up the power source voltage Vcc and the high voltage Vpp supplied from external sources, are supplied to each row decoder $17_1$ to $17_M$. Erase lines 15 are connected to erase voltage generating circuit 19.

A typical power source voltage Vcc is 5 V and a typical high voltage Vpp is 12.5 V. The pulled-up voltages provided by pull-up circuit 18 are 5–10 V and 20 V respectively. Erase voltage generating circuit 19 generates an erase voltage of about 20 V from the high voltage Vpp and selectively outputs this to erase lines 15.

Figure 7:
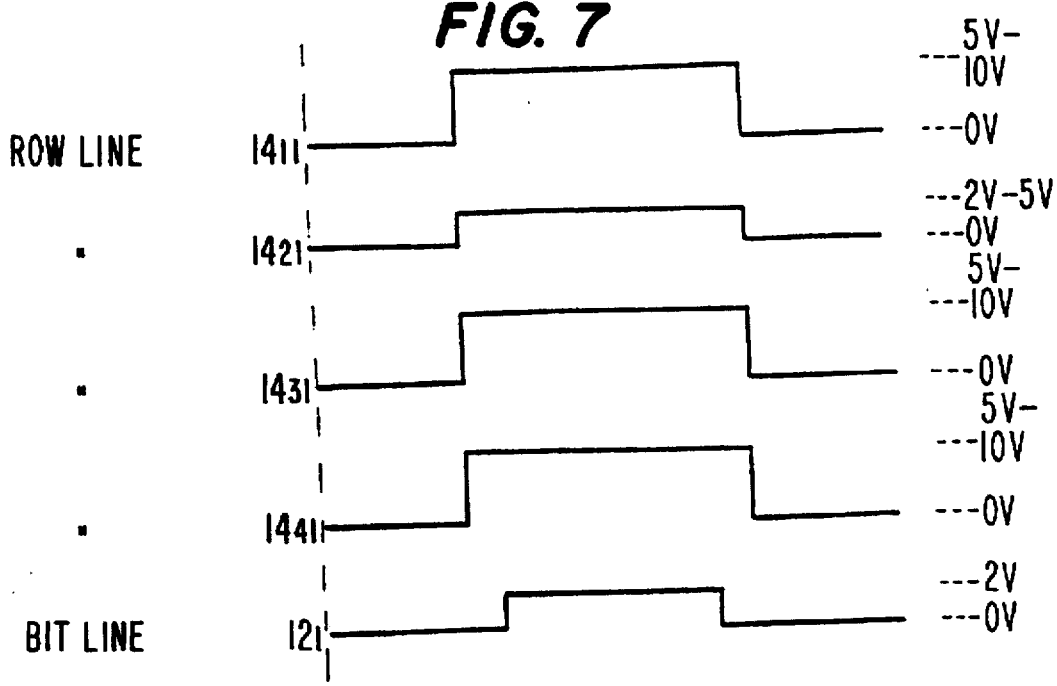
FIG. 7, FIG. 8 and FIG. 11 are timing charts of the memory of the above embodiment.

The operation of the memory shown in FIGS. 2 and 6 will now be described. First, the data reading operation will be described with reference to the timing chart of FIG. 7. Data is to be read from a selected cell of a series circuit unit. Under the control of the output from the row decoder $17_m$ corresponding to the series circuit unit containing the selected cell, voltages are applied to the four row lines $14_{1m}, 14_{2m}, 14_{3m}, 14_{4m}$. A voltage in the range 2 V to 5 V is applied to the row line coupled to the control gate electrode of the selected cell, while a voltage in the range 5 V to 10 V, generated by pull up circuit 18, is applied to the remaining three row lines. The output of the other row decoders 17 is 0 V.

Suppose, for example, the series circuit unit 10 containing the selected cell is coupled to bit line $12_1$ and the four row lines $14_{11}$ to $14_{41}$. Suppose further the selected cell itself is coupled to column line $14_{21}$. Under the control of row decoder $17_1$, a voltage in the range 2 V to 5 V would be applied to row line $14_{21}$. The voltage applied to the remaining three row lines would be in the range 5 to 10 V. Now, each memory cell 11 has had its threshold voltage set in accordance with what was written to it previously in a data write mode. A voltage in the range 2 V to 5 V is higher than the low threshold voltage of the cell just after erasure but lower than the high threshold voltage of the cell after a level "1" has been written to it. A voltage in the range 5 V to 10 V is sufficiently higher than the high threshold voltage of the cell after a level "1", has been written to it. Consequently, applying the voltages described to the four row lines $14_{11}$ to $14_{41}$ has the effect of turning ON the three memory cells whose control gate electrodes are connected to voltage in the range of 5–10 V, namely those cells on row lines $14_{11}$, $14_{31}$, and $14_{41}$. However, the ON or OFF state of the selected cell, whose control gate electrode is connected to row line $14_{21}$, is determined by its threshold voltage which, as noted above, is set during The data write mode.

During data reading, a 2 V read voltage is applied to bit line $12_1$ in response to the output of column decoder 16. If the threshold voltage of the selected transistor is low, corresponding to a level "0" state, the selected transistor is turned on by the voltage of row line $14_{21}$. Thus, the read voltage of 2 V applied to bit line $12_1$ is discharged to ground line $13_1$ through series circuit unit 10. The ground lines 13, as previously noted, are maintained at OV. However, if the threshold voltage of the selected transistor is high, corresponding to a level "1" state, the transistor remains off when the voltage of column line $14_{21}$ is applied. Thus, the read voltage of 2 V applied to bit line $12_1$ is not discharged to ground line 13. In short, the voltage of a bit line 12 depends on whether the threshold voltage of the selected cell is high or low. The discrimination of logic levels "1" and "0" can thus be performed by amplifying the potential difference with a sense amplifier 30 connected to bit line 12. In practice, the voltage applied during data reading to the row lines 14 of the non-selected cells should normally be set at about 8 V.

Figure 8:
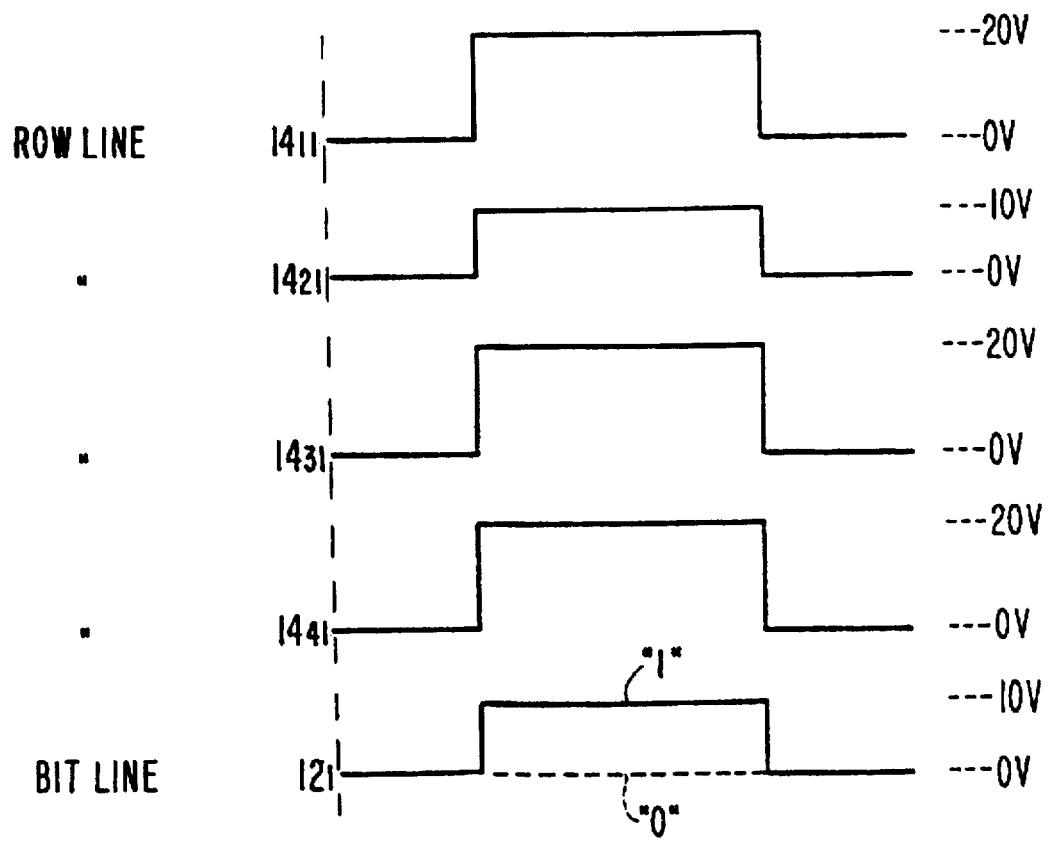

The data writing operation will now be described with reference to the timing chart of FIG. 8. Data is to be written to a selected cell of a series circuit unit. As in data reading, voltages are applied to the four row lines $14_{1m}$, $14_{2m}$, $14_{3m}$, $14_{4m}$ under the control of the out-put from the row decoder $17_m$ corresponding to the series circuit unit containing the selected cell.

A pulled-up voltage of 10 V is applied from pull up circuit 18 to the row line coupled to the control gate electrode of the selected cell while a pulled-up voltage of 20 V is applied to the remaining three row lines. The outputs of all other row decoders 17 are 0 V. As in data reading, it is assumed that the series circuit unit 10 containing the selected cell is coupled to bit line $12_1$ and the selected cell is coupled to row line $14_{21}$. Under the control of row decoder $17_1$, a voltage of 10 V is applied to column line $14_{21}$. A voltage of 20 V is applied to the three remaining row lines. During data writing, two different voltage levels are applied to bit line $12_1$ depending on the write data that is being output from column decoder 16. When writing a level "1", a voltage of 10 V is applied to bit line $12_1$, while a voltage of 0 V is applied when writing a level "0".

Figure 9:
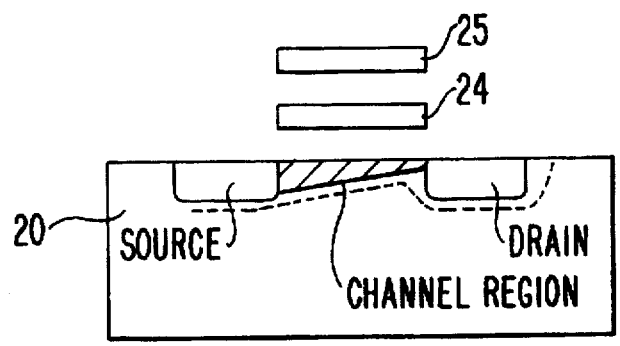
FIG. 9 and FIG. 10 are cross-sectional views showing the non-volatile transistors which are provided with a floating gate electrode and a control gate electrode.

The three memory transistors 11 whose control gate electrodes are coupled to the 20 V by the three row lines $14_{11}$, $14_{31}$, $14_{41}$ operate as triodes i.e., in their non-saturation state. In this operation, a channel region is formed between the source and drain regions, as shown in FIG. 9.

Figure 10:
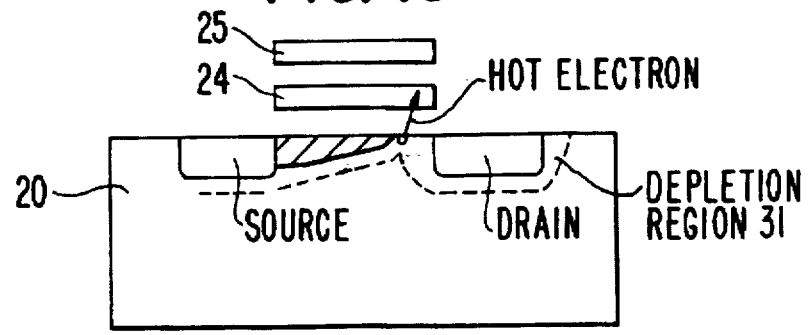

However, the selected memory transistor, whose control gate electrode is supplied with a voltage of 10 V by the row line $14_{21}$, is driven to its saturated state, as shown in FIG. 10. If 10 V is applied between the bit line $12_1$ and the ground line $13_1$, electrons flow from the source region of the four cells 11 in the series circuit unit 10 towards the drain region. The electric field is concentrated in the depletion layer 31 generated, particularly in the vicinity of the drain region of the selected memory transistor 11. As a result, electrons are accelerated and given sufficient energy to cross the energy barrier of the insulating film from the surface of substrate 20 in FIG. 10. These electrons are called "hot electrons". They are drawn toward the control gate electrode 25 of the selected cell which is set to the voltage of 10 V and fly into the floating gate electrode where they are captured. As a result, the floating gate electrode 24 of the selected cell becomes negatively charged, causing the threshold voltage to rise to a high level.

If a voltage of 0 V is applied to bit line $12_1$, the hot electrons are not generated and the threshold voltage stays in its original low state. Thus, data may be written to each individual cell.

Figure 11:
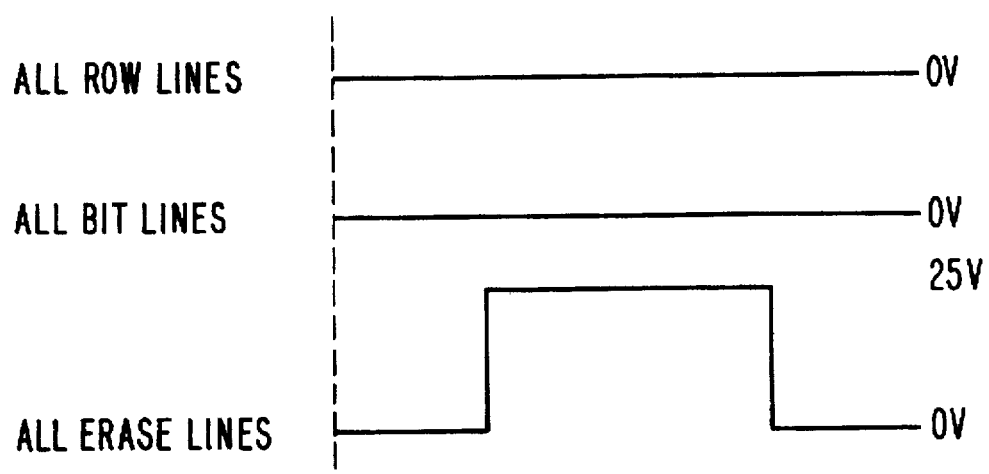

The data erasure will now be described. In data erasure, as shown by the timing chart of FIG. 11, all of the row lines 14 and bit lines 12 are set to 0 V by the output of column decoder 16 and row decoders 17. All the erase lines 15 are set to the high voltage of 25 V by the output of erase voltage generating circuit 19. A high voltage of 25 V is therefore applied to the erase gate electrodes of each cell. As a result, field emission takes place between the floating gate electrode and erase electrode of each cell, causing the electrons that had accumulated at the floating gate electrode to be emitted to the erase gate electrode. As a result, the threshold voltages of each cell return to the low condition and all the cells are erased simultaneously.

During data erasure, erasure of cell data in series circuits 10 can be effected in units of columns by selectively applying the high voltage of 25 V from erase voltage generating circuit 19 only to particular erase lines 15.

Using the processes described above, data may be read and written in bit units and may be erased either simultaneously from all the cells or in units of columns. More importantly, these processes can be carried out in an array requiring one bit line and one erase line per series circuit unit, which in the above embodiment, comprises four cells. This is in marked contrast to prior art arrays where a bit line and an erase line were required for each bit or cell. Thus, utilizing the present invention, it is possible to produce memory cell arrays with a high integration density. In addition, fewer contacts are required to connect the cells with the bit line. The present invention requires one contact with the bit line for every four cells. This can lead to an increase in production yield.

Figure 12:
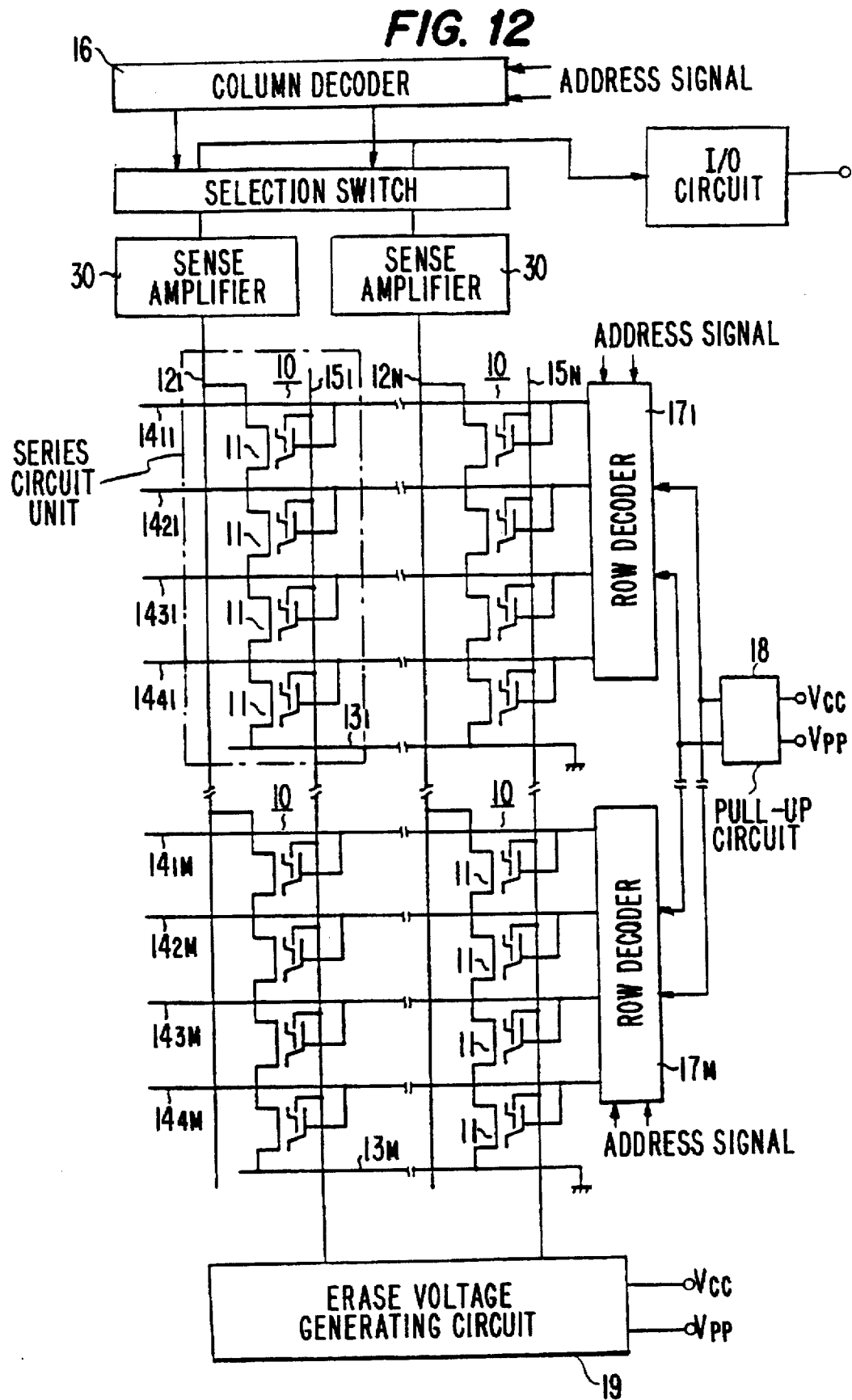
FIG. 12 is a circuit diagram showing the entire layout, including peripheral circuitry, of the memory of a further embodiment.
Figure 13:
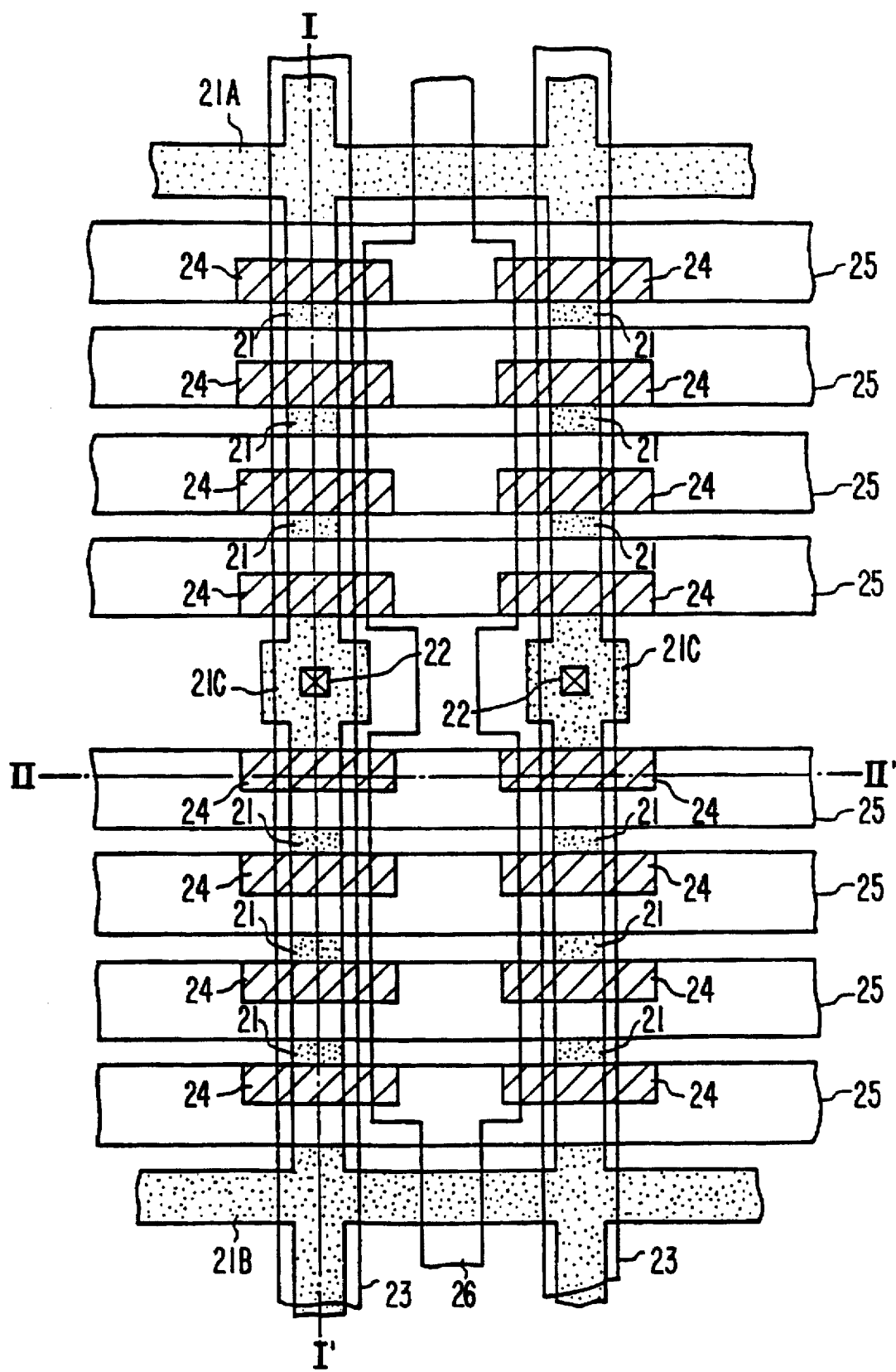
FIG. 13 is a plan view of a pattern showing the memory cell array of the circuit diagram corresponding to FIG. 12.
Figure 14:
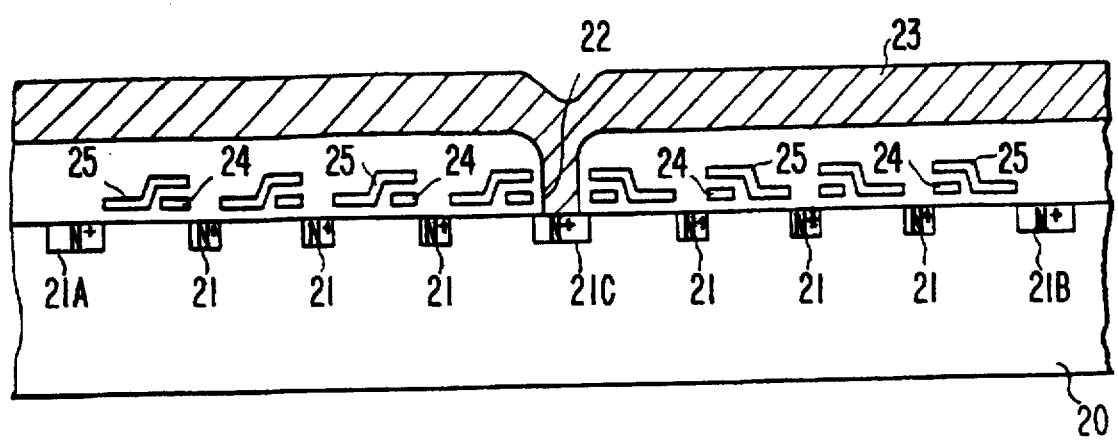
FIG. 14 and FIG. 15 are cross-sectional views taken along lines I–I', II–II', respectively, of FIG. 13.
Figure 15:
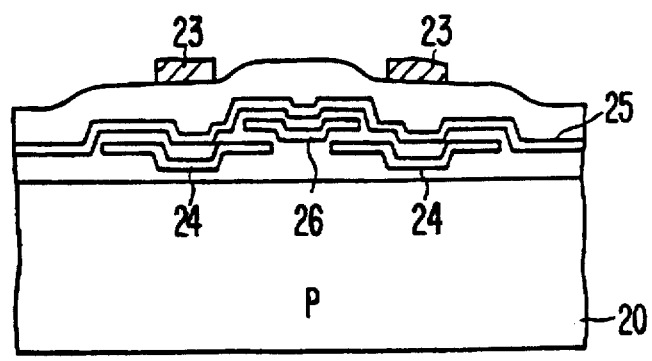

FIGS. 12 to 15 show another embodiment of this invention. FIG. 12 is a circuit diagram showing the overall construction of this embodiment together with its peripheral circuitry. In this memory, series circuit unit 10 consists of four cells 11 connected in series. Again, in practice various numbers of cells may be used and this embodiment should not be understood as limited in this respect. The cells 11 comprise the series connection of a floating gate electrode transistor having an erase gate electrode with an enhancement type MOS transistor. FIG. 13 is a plan view of the pattern of the structure of the memory cell array in FIG. 12. FIG. 14 is a cross-sectional view along the line I–I' in FIG. 13. FIG. 15 is a cross-sectional view along the line II–II' in FIG. 13.

Each of the memory cells 11 comprising series circuit unit 10 includes a non-volatile transistor having: a source region; a drain region; a floating gate electrode arranged above the channel region along part of the channel length between the source and drain region; a control gate electrode provided over the floating gate electrode and across the channel region where the floating gate electrode is not provided; and an erase gate electrode arranged so as to overlap the floating gate electrode. The control gate of the non-volatile transistor also functions as the gate electrode of the enhancement type MOS transistor connected in series.

In FIGS. 13, 14, and 15, electrodes 24, made of a first polycrystalline silicon layer and put in a floating electrical state, are formed over the channel region between adjacent N+ type regions 21 along part of the channel length and are insulated therefrom by an insulating film. Electrodes 24 are the floating gate electrodes of each memory cell 11. Electrodes 25, made of a third polycrystalline silicon layer, are formed over the plurality of electrodes 24, insulated therefrom by an insulating film, and over the channel regions where the electrodes 24 are not provided. Electrodes 25 are the control gate electrodes and the gate electrodes of the enhancement MOS transistor and serve as the row line 14 of each memory cell 11. Electrodes 26, made of a second polycrystalline silicon layer, are formed between adjacent columns of series circuit units 10, insulated therefrom by an insulating film. These electrodes 26 overlap part of electrodes 24 which, as noted, are the floating gate electrodes of each cell. Electrodes 26 are the erase gate electrodes and serve as the erase line 15 of each memory cell 11. In this embodiment, the enhancement MOS transistor is switched by The signal of control gate electrode 25 of the floating gate transistor during the reading and writing modes.

This invention is not restricted to the above embodiments and may be modified in various ways. For example, in the above embodiment during data reading, a voltage in the range of 2 V to 5 V was applied to the row line 14 that was coupled to the selected cell, while a voltage in the range 5 V to 10 V was applied to the remaining three row lines. These voltages should be set in accordance with the threshold voltage corresponding to the level "1" and level "0" of memory cell 11. The 2 V read voltage applied to bit line 12 may also be altered as required. It is desirable to set this read voltage as low as possible to suppress what is known as the "soft write" phenomenon during the read mode.

Furthermore, in the above embodiments during data writing, a voltage of 10 V was applied only to the row line 14 that was coupled to the selected cell and a voltage of 20 V was applied to the remaining three row lines. These voltages actually need only be high enough to inject a sufficient number of electrons into the floating gate electrode of the selected cell by its saturation operation and to drive the non-selected cells to their non-saturation state (triode operation).

In addition, although the memory of the above embodiments series circuit unit 10 comprised four memory cells in series, the series connection of 8, 16 or 32 memory cells may be employed. If, for example, series circuit 10 comprises 8 memory cells in series, the degree of integration may be increased 2 or more times over that of the prior art memory. This can result in a considerable reduction in costs.

The above embodiment was described assuming that the electrodes 25 in FIG. 3, serving as the control gate electrodes and row lines 14 of each cell, were made of a polycrystalline silicon. However, other high melting-point metallic silicides, such as titanium silicide, molybdenum silicide, or other melting-point metals, may be used.

Further, although in the above embodiments erasure of the data was effected for all the cells at once, they may be erased a column at a time.

Figure 16:
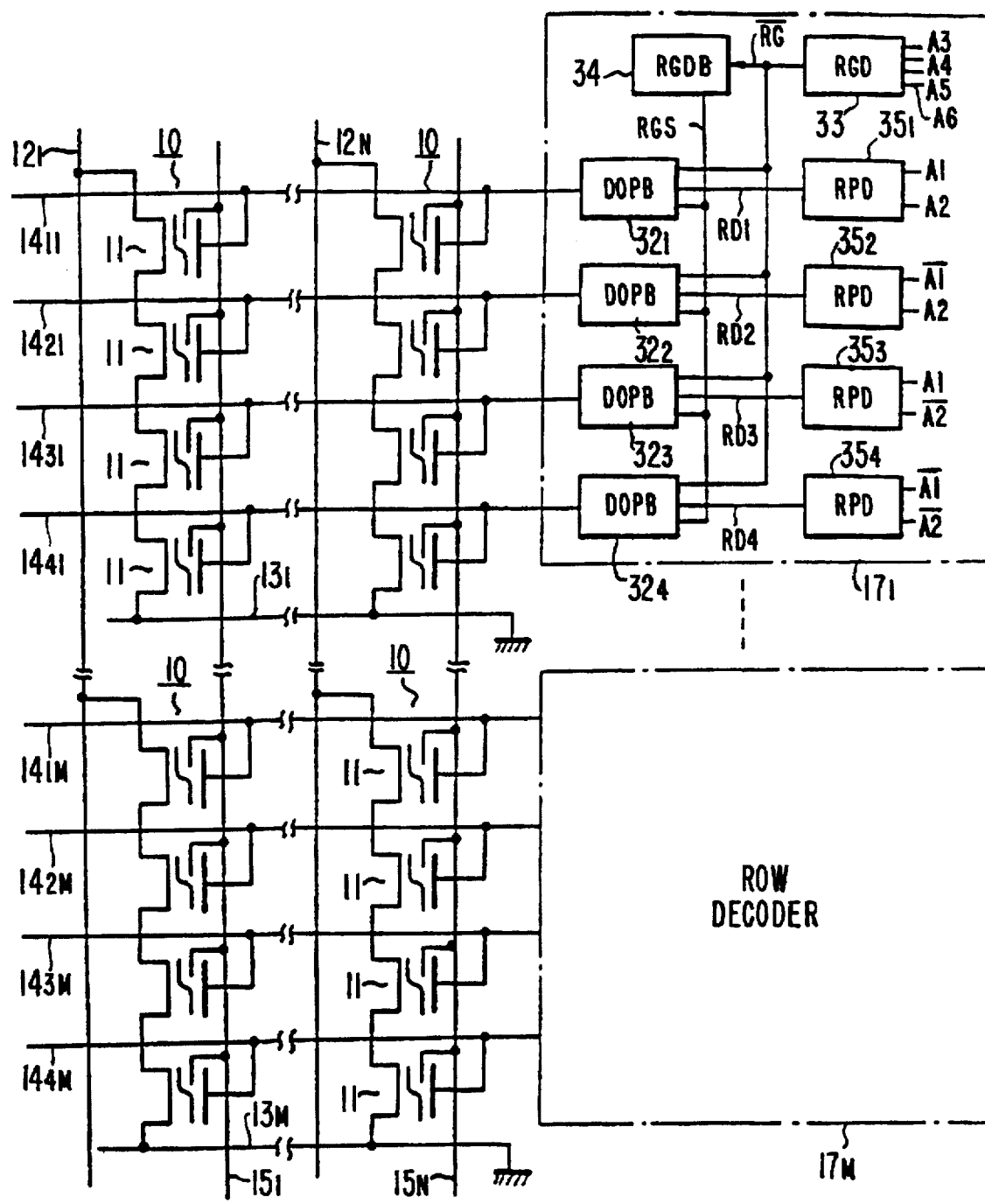
FIG. 16 shows a detailed portion of the row decoders of FIGS. 6 and 12.

FIGS. 16–20 illustrate the details of the peripheral circuitry associated with the embodiments of FIGS. 6 and 12 and will now be discussed. FIG. 16 is a circuit diagram of the entire circuit, showing in detail that portion of a row decoder 17 which applies a high voltage of 10 V or 20 V to the row lines 14 in order to write data into the memory shown in FIGS. 6 and 12. One of row decoders $17_1$ to $17_M$ is activated by a 4-bit address consisting of bits A3, A4, A5, and A6. The decoded output of the activated row decoder 17 selects a plurality of series circuits 10 coupled together in the corresponding row of series circuit units. In addition, one of the four row lines coupled to this plurality of series circuits 10 is selected by a 2-bit address consisting of bits A1 and A2.

Each row decoder 17 is provided with a column group decoder (BGD) 33 coupled to receive the 4-bit address, i.e., a combination of address bits A3, A4, A5, and A6, each bit having either a positive or negative phase. The decoded output of RGD 33, $\overline{RG}$, is supplied to row group decoder buffer (RGDB) 34. It is simultaneously supplied to the four decoder-output buffers (DOPBs) $32_1$ to $32_4$, which are provided for each of the four row lines 14 and which output the high voltage of 10 V or 20 V. The output RGS of RGDB 34 is also supplied to DOPBS $32_1$ to $32_4$.

Each row decoder 17 is also provided with four row part decoders (RPDs) $35_1$ to $35_4$, each coupled to receive the 2-bit address, i.e., a combination of address bits A1 and A2, each bit having either a positive or negative phase. The decoded outputs RD1 to RD4 of RPDs $35_1$ to $35_4$ are supplied to the corresponding one of DOPBs $32_1$ to $32_4$. DOPBs $32_1$ to $32_4$ output the high voltage of 10 V or 20 V or a ground voltage of 0 V to the corresponding row line 14 in response to the output, $\overline{RG}$ of RGD 33, the output RGS of RGDB 34, and the outputs of RPDs 35

Figure 17:
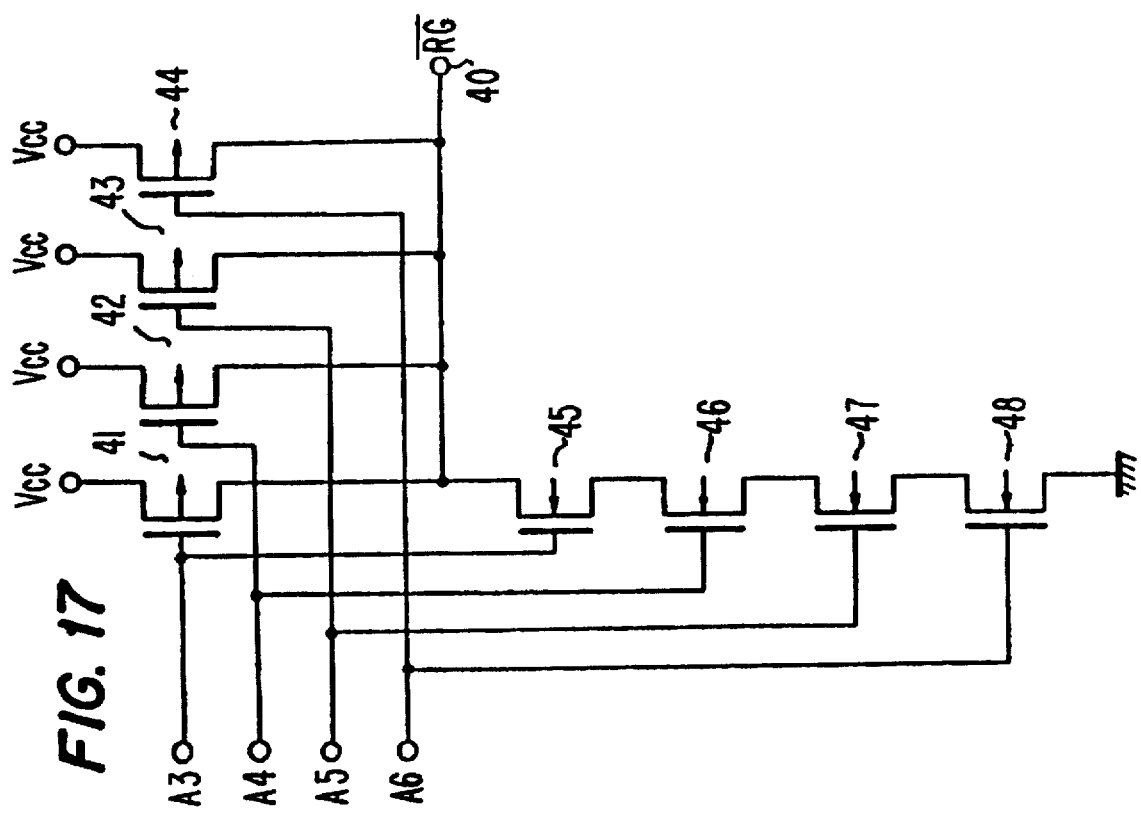
FIG. 17 is a circuit diagram of a row group decoder.

FIG. 17 is a circuit diagram showing, in detail, the RGD 33 provided for each row decoder 17. RGD 33 comprises four P-type MOS transistors 41 to 44 and four N-type MOS transistors 45 to 48. Transistors 41 to 44 are connected in parallel, each coupled between power-source voltage terminal Vcc and node 40 for the output signal $\overline{BG}$. Address bits A3, A4, A5, and A6 are supplied to the gates of MOS transistors 41 to 44, respectively. Transistors 45 to 48 are connected in series, coupled between output node 40 and the ground. Address bits A3, A4, A5, and A6 are supplied to the gates of these transistors 45 to 48, respectively. The RGDs 33 provided in other row decoders 17 have the same structure, but the phases of address bits A3, A4, A5, and A6 differ.

Figure 18:
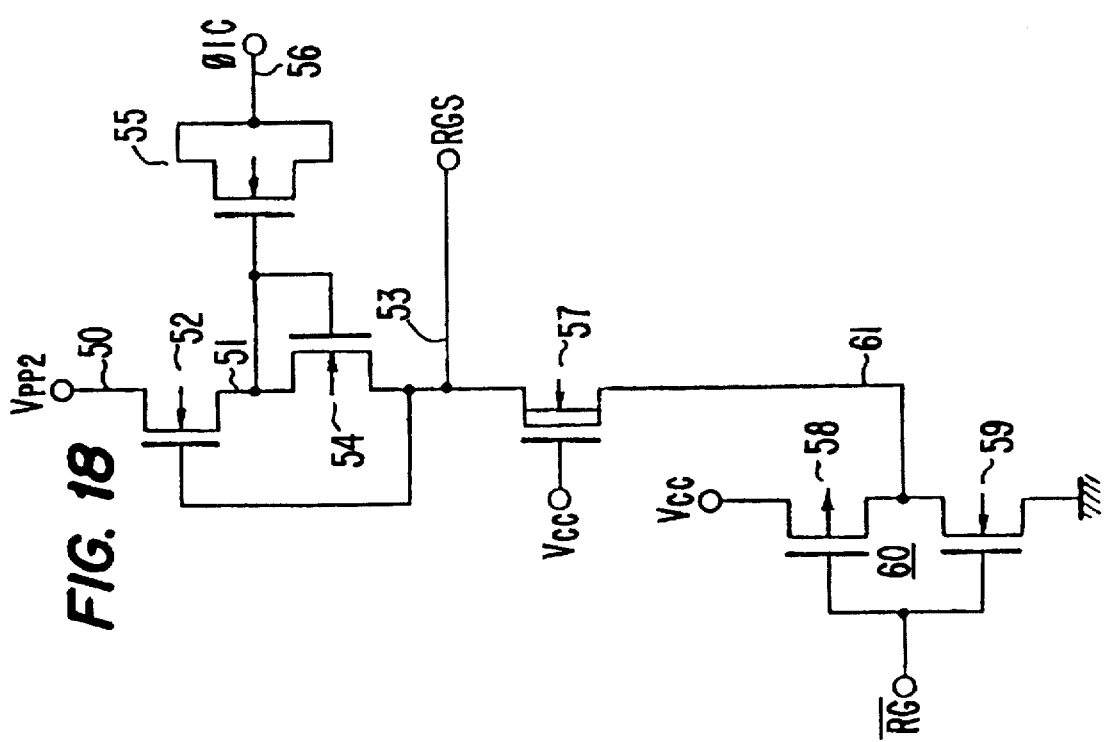
FIG. 18 is a circuit diagram of a row group decoder buffer.

FIG. 18 is a circuit diagram showing, in detail, BGDB 34 provided for each row decoder 17. N-type MOS transistor 52 is coupled between nodes 50 and 51. High voltage Vpp2 is applied to node 50. An N-type MOS transistor 54 is connected between node 51 and node 53 which provides output signal BGS. The gate of transistor 52 is also coupled to node 53. The gate of transistor 54 is coupled to node 51. Capacitor 55 comprising an N-type MOS transistor is connected, at one end, to node 51. The other end of capacitor 55 is coupled to node 56 for receiving clock signal 1C. Depletion-type N-type MOS transistor 57 is connected, at one end, to node 53. The other end of transistor 57 is connected to the output node 61 of CMOS inverter 60. CMOS inverter 60 is comprised of P-type MOS transistor 58 and N-type MOS transistor 59 and is coupled to receive the decoded output $\overline{RG}$ of RGD 33. Voltage Vcc is supplied to the gate of depletion-type transistor 57 at all times. All transistors used in this circuit, except for transistor 57, are enhancement-type.

Figure 19:
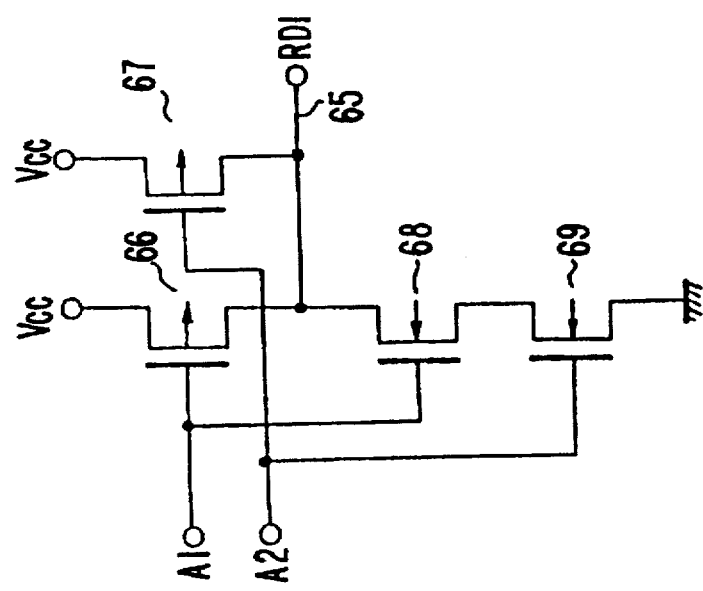
FIG. 19 is a circuit diagram of a row part decoder.

FIG. 19 is a circuit diagram showing, in detail, one of the RPDs 35 provided in each row decoder 17. More precisely, it depicts RPD $35_1$ to which address bits A1 and A2 are input. Two P-type MOS transistors 66 and 67 are connected in parallel, each coupled between power-source voltage terminal Vet and node 65 for output signal RD1. Address bits A1 and A2 are supplied to the gates of transistors 66 and 67 respectively. N-type MOS transistors 68 and 69 are connected in series, coupled between node 65 and the ground. Address bits A1 and A2 are supplied to the gates of transistors 68 and 69 respectively. The other RPDs 35 have the same structure as the RPD shown in FIG. 19, but the phases of the input address bits differ.

Figure 20:
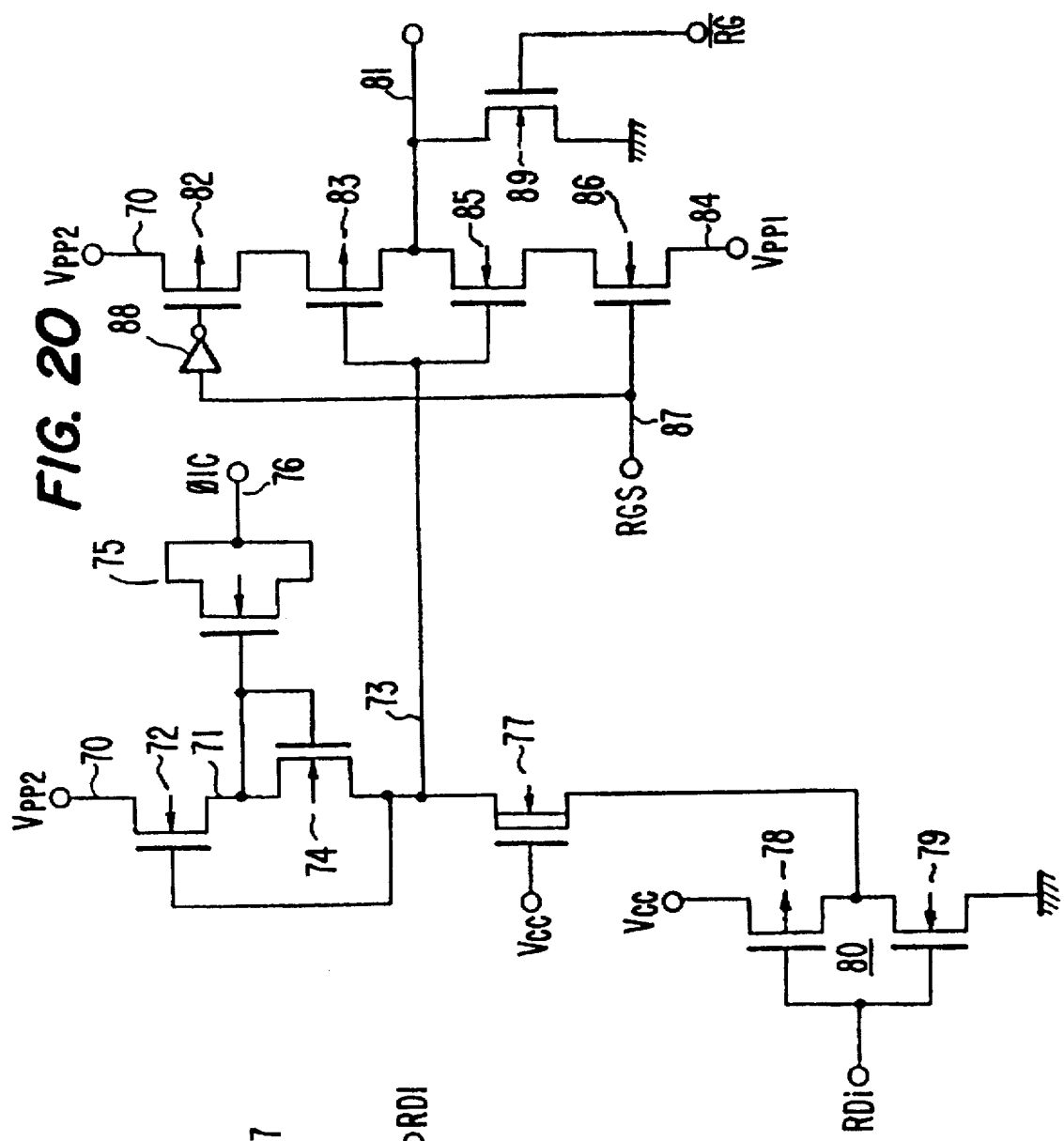
FIG. 20 is a circuit diagram of a decode-output buffer.

FIG. 20 is a circuit diagram showing, in detail, one of DOPBs 32 provided in each row decoder 17. N-type MOS transistor 72 is coupled between nodes 70 and 71. High voltage Vpp2 is supplied to node 70. N-type MOS transistor 74 is coupled between node 71 and node 73. The gate of transistor 72 is coupled to node 73 and the gate of transistor 74 is coupled to node 71. Capacitor 75 comprising an N-type MOS transistor is coupled, at one end, to node 71. The other end of capacitor 75 is connected to node 76 to which clock signal o1C is supplied. Depletion-type, N-type MOS transistor 77 is connected, at one end, to node 73. Voltage Vcc is always supplied to the gate of transistor 77. The other end is connected to the output node of CMOS inverter 80 comprising P-type MOS transistor 78 and N-type MOS transistor 79 and which is coupled to receive the decoded output RDi of RPD 35i.

In addition, two P-type MOS transistors 82 and 83 are connected in series between nodes 70 and 81. Node 81 is coupled to row line 14 (shown in FIG. 16). Two N-type MOS transistors 85 and 86 are connected in series between nodes 81 and 84. High voltage Vpp1 is supplied to node 84. The gate of MOS transistor 82 is coupled through inverter 88 to node 87, to which signal RGS output from RGDB 34 is supplied. The gate of transistor 86 is directly connected to node 87. The gates of transistors 83 and 85 are coupled to node 73. N-channel MOS transistor 89 is coupled between node 81 and the ground. The gate of transistor 89 is coupled to receive signal $\overline{RG}$ from RGD 33. All transistors used in this circuit, except for transistor 77, are enhancement type.

Assume that all address bits A1 to A6 are set to level "1" in order to write data into the memory of the structure shown in FIG. 16. Then, the decoded output $\overline{RG}$ of RGD 33 of row decoder $17_1$, and the decoded output RD1 of RPD $35_1$ also of decoder $17_1$ are set to "0". More specifically, in the RGD 33 shown in FIG. 17, the four address bits A3 to A6 are all set to level "1", turning P-type MOS transistors 41 to 44 off and N-type MOS transistors 45 to 48 on. As a result, output node 40 is discharged through transistors 45 to 48, and the signal $\overline{RG}$ obtained at node 40 is set to level "0", i.e., 0 V. In RPD $35_1$ shown in FIG. 19, two address bits A1 and A2 are set to level "1", turning N-type MOS transistors 68 and 69 on. Therefore, node 65 is discharged via transistors 68 and 69, and signal RD1 is also set to level "0", i.e., 0 V. In the other RPDs $35_2$ to $35_4$ provided in row decoder $17_1$, one of address bits A1 or A2 is set to level "0". Hence, at least one of the two P-type MOS transistors 66 and 67 is turned on. As a result, signals RD2 to RD4 are set to level "1", i.e., Vcc.

When signal $\overline{RG}$ is set to "0", the output signal RGS of RGDB 34 is set to a voltage equal to or higher than Vpp2. More specifically, in RGDB 34 shown in FIG. 18, the output node 61 of CMOS inverter 60 is set to "1" (Vcc) when signal $\overline{RG}$ is set to "0". Since voltage Vcc is applied to the gate of depletion-type transistor 57, node 53 is also set to "1" (Vcc). Transistor 52 is thereby turned on, and node 51 is quickly charged with the high voltage Vpp2 applied to node 50. Thus, transistor 54 is also turned on and node 53 is charged with high voltage Vpp2. Thereafter, the voltage at node 53 is raised every time clock signal 1C changes from "0" to "1" due to the coupling capacitance of capacitor 55 with transistor 54 junctioning as a rectifying element. The signal RGS obtained at node 53 is set to a level equal to or higher than Vpp2.

DOPB $32_1$, which receives the output $\overline{RG}$ of RGD 33, the output RGS of RGDB 34, and the output RD1 of RDB $35_1$, outputs a high voltage Vpp1 of 10 V to the selected column line $14_{11}$. More specifically, in DOPB 32 shown in FIG. 20, transistor 86 is turned on since signal RGS is set to a high voltage of 20 V or more. The output of inverter 88, to which signal RGS is input, is set to "0". Hence, transistor 82 is also turned on. Since the decoded output RD1 of RPD $35_1$ is "0" at this time, a high voltage of 20 V or more is output to node 73, as in the circuit of FIG. 18. As a result, transistor 85 is turned on. At this time, the output $\overline{RG}$ from RGD 33 is "0", and transistor 89 is off. Therefore, node 81 is charged with voltage Vpp1 through transistors 86 and 85. Since a high voltage of 20 V or more is applied to the gates of both transistors 86 and 85 at this time, Vpp1 of 10 V is applied directly to node 81.

In each of other DOPBs $32_1$ to $32_4$ provided in row decoder $17_1$, which are coupled to the row lines other than selected row line $14_{11}$, the decoded outputs RD2 to RD4 of RPD $35_2$ to $35_4$ are set to "1", and node 73 is set to the ground voltage. Therefore, in the circuit of FIG. 20, transistor 83 is turned on, transistor 85 is turned off, and node 81 is charged with voltage Vpp2 through transistors 82 and 83. Hence, DOPBs $32_2$ to $32_4$ of row decoder $17_1$ output a high voltage 20 V to row lines $14_{21}$, $14_{31}$, and $14_{41}$, respectively.

In any row decoder other than decoder $17_1$, the decoded output $\overline{RG}$ of RGD 33 is set to "1", turning the transistor 89 provided in each DOPB 32 (FIG. 21) on. As a result, the output voltage of DOPB 32 is 0 V, i.e., the ground voltage.

An oscillation circuit may be used for generating clock signal 1C and clock signal 2C (described later) for use in circuits of FIGS. 18 and 20. This oscillation circuit is known in the prior art as a ring oscillator. It comprises an odd number of CMOS inverters, for example five, connected in cascade and each made of a P-type and N-type MOS transistor. Transfer gates are connected between these inverters and function as resistive elements, each comprising a P-type and an N-type MOS transistor. Capacitors are coupled to the connection point of the adjacent CMOS inverter and transfer gate.

A PULL UP circuit may be used for generating high voltages Vpp1 and Vpp2 used in column decoder 17. This circuit is of the well-known charge-pump type. It comprises a plurality of PULL UP units connected in cascade. Each unit comprises an N-type MOS transistor functioning as a load transistor, N-type MOS transistor functioning as a rectifying transistor, and a capacitor. Clock signals 1C and 2C, which have been obtained by the oscillation circuit described above, are alternately input to one end of capacitor.

While the foregoing description is directed to only a few presently preferred embodiments it will be obvious to one of ordinary skill that numerous modifications may be made without departing from the true spirit or scope of the invention which is to be limited only by the appended claims.

I claim:

1. A semiconductor memory device, comprising:

memory cells formed in a row and column array, wherein the memory cells in each column are arranged to form circuit units each including at least two memory cells connected in series;

a plurality of bit lines, each bit line connecting the circuit units in one column of said array;

a plurality of row lines, each row line connecting the memory cells in one row of said array;

decoding means responsive to address data for selecting a memory cell in one of said circuit units by applying voltages to said row lines and said bit lines, said decoding means including row decoding means responsive to the address data for applying a ground voltage to all row lines other than the row lines coupled to the memory cells in said one of said circuit units.

2. The semiconductor memory device according to claim 1, wherein said circuit units each comprise four memory cells connected in series.

3. The semiconductor memory device according to claim 1, wherein said memory cells comprise electrically programmable non-volatile transistors.

4. The semiconductor memory device according to claim 3, wherein said electrically programmable non-volatile transistors each include a control gate electrode, a floating gate electrode, and means for erasing data stored therein.

5. The semiconductor memory device according to claim 4, wherein said means for erasing data comprises means for electrically erasing data.

6. The semiconductor memory device according to claim 5, wherein said means for electrically erasing data comprises an erase gate electrode.

7. A semiconductor memory device, comprising:

memory cells formed in a row and column array, wherein the memory cells in each column are arranged to form circuit units each including at least two memory cells connected in series;

a plurality of bit lines, each bit line connecting the circuit units in one column of said array;

a plurality of row lines, each row line connecting the memory cells in one row of said array;

decoding means responsive to address data for selecting a memory cell in one of said circuit units by applying voltages to said row lines and said bit lines, said decoding means including row decoding means responsive to the address data for applying a first voltage to the row line coupled to the selected cell of said one of said circuit units, a second voltage to the row lines coupled to unselected memory cells of said one of said circuit units, and a ground voltage to all other row lines.

8. The semiconductor memory device according to claim 7, wherein said circuit units each comprise four memory cells connected in series.

9. The semiconductor memory device according to claim 7, wherein said memory cells comprise electrically programmable non-volatile transistors.

10. The semiconductor memory device according to claim 9, wherein during a data reading operation, the first voltage is higher than a threshold voltage of a non-volatile transistor storing low-level binary data and lower than a threshold voltage of a non-volatile transistor storing high-level binary data, and the second voltage is higher than the threshold voltage of the non-volatile transistor storing the high-level binary data.

11. The semiconductor memory device according to claim 9, wherein during a data writing operation, the first voltage drives the non-volatile transistor of the selected memory cell of said one of said circuit units to a saturation state, and the second voltage drives the non-volatile transistors of the unselected memory cells in said one of said circuit units to a non-saturation state.

12. The semiconductor memory device according to claim 9, wherein said electrically programmable non-volatile transistors each include a control gate electrode, a floating gate electrode, and means for erasing data stored therein.

13. The semiconductor memory device according to claim 12, wherein said means for erasing data comprises means for electrically erasing data.

14. The semiconductor memory device according to claim 13, wherein said means for electrically erasing data comprises an erase gate electrode.

15. A semiconductor memory device, comprising:

first and second circuit units, each of said first and second circuit units having a first end connected to a predetermined potential and comprising at least two memory cells connected in series;

a bit line connected to second ends of each of said first and second circuit units;

a plurality of row lines, each row line connected to one of the memory cells of said first and second circuit units;

decoding means responsive to address data for selecting a memory cell in one of said first and second circuit units by applying voltages to said row lines and said bit line, said decoding means including row decoding means responsive to the address data for applying a first voltage to the row line coupled to the selected cell of said one of said first and second circuit units, a second voltage to the row lines coupled to unselected memory cells of said one of said first and second circuit units, and a ground voltage to all row lines coupled to the memory cells in the other of said first and second circuit units.

16. The semiconductor memory device according to claim 15, wherein said circuit units each comprise four memory cells connected in series.

17. The semiconductor memory according to claim 16, wherein said row decoding means comprises:

a first row decoder circuit coupled to the row lines connected to the memory cells of said first circuit unit; and a second row decoder circuit coupled to the row lines connected to the memory cells of said second circuit unit.

18. The semiconductor memory device according to claim 15, wherein said memory cells comprise electrically programmable non-volatile transistors.

19. The semiconductor memory device according to claim 18, wherein during a data reading operation, the first voltage is higher than a threshold voltage of a non-volatile transistor storing low-level binary data and lower than a threshold voltage of a non-volatile transistor storing high-level binary data, and the second voltage is higher than the threshold voltage of the non-volatile transistor storing the high-level binary data.

20. The semiconductor memory device according to claim 18, wherein during a data writing operation, the first voltage drives the non-volatile transistor of the selected memory cell of in said one of said first and second circuit units to a saturation state, and the second voltage drives the non-volatile transistors of unselected memory cells in said one of said first and second circuit units to a non-saturation state.

21. The semiconductor memory device according to claim 18, wherein said electrically programmable non-volatile transistors each include a control gate electrode, a floating gate electrode, and means for erasing data stored therein.

22. The semiconductor memory device according to claim 21, wherein said means for erasing data comprises means for electrically erasing data.

23. The semiconductor memory device according to claim 22, wherein said means for electrically erasing data comprises an erase gate electrode.

24. A semiconductor memory device, comprising:

first and second circuit units, each of said first and second circuit units having a first end connected to a predetermined potential and comprising at least two memory cells connected in series;

a bit line connected to second ends of each of said first and second circuit units;

a plurality of row lines, each row line connected to one of the memory cells of said first and second circuit units;

decoding means responsive to address data for selecting a memory cell in one of said first and second circuit units by applying voltages to said row lines and said bit line, said decoding means including row decoding means responsive to the address data for applying a first voltage to the row line coupled to the selected cell of said one of said first and second circuit units, a second voltage to the row lines coupled to unselected memory cells of said one of said first and second circuit units, and a ground voltage to all row lines coupled to the memory cell in the other of said first and second circuit units, wherein said row decoding means comprises:

a first row decoder circuit coupled to the row lines connected to the memory cells of said first circuit unit; and a second row decoder circuit coupled to the row lines connected to the memory cells of said second circuit unit, and wherein said address data comprises address data bits and each of said first and second row decoder circuits comprises:

a row group decoder receiving first ones of said address data bits and outputting a row group decoder output signal;

row part decoders receiving second ones of said address data bits and outputting corresponding row part decoder output signals;

a row group decoder buffer receiving said row group decoder output signal and outputting a row group decoder buffer output signal; and decoder output buffers, each connected to a corresponding one of said row lines and responsive to said row group decoder output signal, a corresponding one of said row part decoder output signals, and said row group decoder buffer output signal, for selectively outputting one of said first voltage, said second voltage, and said ground voltage to the corresponding row lines.

25. The semiconductor memory device according to claim 24, wherein said row group decoder comprises:

input terminals receiving said first ones of said address data bits;

an output terminal for outputting said row group decoder output signal;

a plurality of first metal oxide semiconductor (MOS) transistors of a first conductivity type connected in series between said output terminal and a first potential, the gates of each of said first MOS transistors supplied with a respective one of said first ones of said address data bits; and a plurality of second MOS transistors of a second conductivity type opposite the first conductivity type, each connected between said output terminal and a second potential, the gates of each of said second MOS transistors supplied with a respective one of said first ones of said address data bits.

26. The semiconductor memory device according to claim 24, wherein each row part decoder comprises:

input terminals receiving said second ones of said address data bits;

an output terminal for outputting a corresponding one of said row part decoder output signals;

a plurality of first metal oxide semiconductor (MOS) transistors of a first conductivity type connected in series between said output terminal and a first potential, the gates of each of said first MOS transistors supplied with a respective one of said second ones of said address data bits; and a plurality of second MOS transistors of a second conductivity type opposite the first conductivity type each connected between said output terminal and a second potential, the gates of each of said second MOS transistors supplied with a respective one of said second ones of said address data bits.

27. A semiconductor memory device, comprising:

first and second circuit units, each of said first and second circuit units having a first end connected to a predetermined potential and comprising at least two memory cells connected in series;

a bit line connected to second ends of each of said first and second circuit units;

a plurality of row lines, each row line connected to one of the memory cells of said first and second circuit units;

decoding means responsive to address data for selecting a memory cell in one of said first and second circuit units by applying voltages to said row lines and said bit line, said decoding means including row decoding means responsive to the address data for applying a first voltage to the row line coupled to the selected cell of said one of said first and second circuit units, a second voltage to the row lines coupled to unselected memory cells of said one of said first and second circuit units, and a ground voltage to all row lines coupled to the memory cells in the other of said first and second circuit units, wherein said row decoding means comprises:

a first row decoder circuit coupled to the row lines connected to the memory cells of said first circuit unit; and a second row decoder circuit coupled to the row lines connected to the memory cells of said second circuit unit, and wherein said address data comprises address data bits and each of said first and second row decoder circuits comprises:

a row group decoder receiving first ones of said address data bits and outputting a row group decoder output signal;

row part decoders receiving second ones of said address data bits and outputting corresponding row part decoder output signals;

a row group decoder buffer receiving said row group decoder output signal and outputting a row group decoder buffer output signal; and decoder output buffers, each connected to a corresponding one of said row lines and responsive to said row group decoder output signal, a corresponding one of said row part decoder output signals, and said row group decoder buffer output signal, for selectively outputting one of said first voltage, said second voltage, and said ground voltage to the corresponding row lines, and wherein said row group decoder buffer comprises:
 a first input terminal receiving said row group decoder output signal;
 a second input terminal receiving a clock signal;
 an output terminal for outputting said row group decoder buffer output signal;
 an inverter having an input connected to said first input terminal;
 a first depletion-type metal oxide semiconductor (MOS) transistor of a first conductivity type having a first terminal connected to an output of said inverter, a second terminal connected to said output terminal, and a gate connected to a first potential;
 a second MOS transistor of the first conductivity type having a first terminal connected to said output terminal, a second terminal, and a gate connected to said second terminal of said second MOS transistor;
 a third MOS transistor of the first conductivity type having a first terminal connected to a second potential, a second terminal connected to the second terminal of said second MOS transistor, and a gate connected to said output terminal; and
 a fourth MOS transistor of the first conductivity type having first and second terminals connected to said second input terminal and a gate connected to said second terminal of said second MOS transistor.

28. A semiconductor memory device, comprising:

first and second circuit units, each of said first and second circuit units having a first end connected to a predetermined potential and comprising at least two memory cells connected in series;

a bit line connected to second ends of each of said first and second circuit units;

a plurality of row lines, each row line connected to one of the memory cells of said first and second circuit units;

decoding means responsive to address data for selecting a memory cell in one of said first and second circuit units by applying voltages to said row lines and said bit line, said decoding means including row decoding means responsive to the address data for applying a first voltage to the row line coupled to the selected cell of said one of said first and second circuit units, a second voltage to the row lines coupled to unselected memory cells of said one of said first and second circuit units, and a ground voltage to all row lines coupled to the memory cells in the other of said first and second circuit units, wherein said row decoding means comprises:
 a first row decoder circuit coupled to the row lines connected to the memory cells of said first circuit unit; and
 a second row decoder circuit coupled to the row lines connected to the memory cells of said second circuit unit, wherein said address data comprises address data bits and each of said first and second row decoder circuits comprises:
 a row group decoder receiving first ones of said address data bits and outputting a row group decoder output signal;
 row part decoders receiving second ones of said address data bits and outputting corresponding row part decoder output signals;
 a row group decoder buffer receiving said row group decoder output signal and outputting a row group decoder buffer output signal; and
 decoder output buffers, each connected to a corresponding one of said row lines and responsive to said row group decoder output signal, a corresponding one of said row part decoder output signals, and said row group decoder buffer output signal, for selectively outputting one of said first voltage, said second voltage, and said ground voltage to the corresponding row lines, and wherein said decoder output buffers each comprise:
 a first input terminal for receiving a row part decoder output signal from a corresponding one of said row part decoders;
 a second input terminal for receiving said row group decoder output signal;
 a third input terminal for receiving said row group decoder buffer output signal;
 a fourth input terminal receiving a clock signal;
 a first inverter having an input connected to said first input terminal;
 a depletion-type first metal oxide semiconductor (MOS) transistor of a first conductivity type having a first terminal connected to an output of said first inverter, a second terminal, and a gate connected to a first potential;
 a second MOS transistor of the first conductivity type having a first terminal connected to the second terminal of said first MOS transistor, a second terminal, and a gate connected to said second terminal of said second MOS transistor;
 a third MOS transistor of the first conductivity type having a first terminal connected to a second potential, a second terminal connected to said second terminal of said second MOS transistor, and a gate connected to said second terminal of said first MOS transistor;
 a fourth MOS transistor of the first conductivity type having first and second terminals connected to said fourth input terminal, and a gate connected to said second terminal of said second MOS transistor;
 a fifth MOS transistor of a second conductivity type, a sixth MOS transistor of the second conductivity type, a seventh MOS transistor of the first conductivity type and an eighth MOS transistor of the first conductivity type connected in series between said second potential and a third potential, a gate of said sixth MOS transistor connected to said second terminal of said first MOS transistor, a gate of said seventh MOS transistor connected to said second terminal of said first MOS transistor, and a gate of said eighth MOS transistor connected to said third input terminal;
 a second inverter having an input connected to said third input terminal and an output connected to a gate of said fifth MOS transistor;
 a ninth MOS transistor having a first terminal connected to a connection node between said sixth and seventh MOS transistors, a second terminal connected to a fourth potential, and a gate connected to said second input terminal; and
 an output terminal connected to said connection node between said sixth and seventh MOS transistors.

* * * * *